(12) United States Patent
Hamaya

(10) Patent No.: US 7,646,488 B2
(45) Date of Patent: Jan. 12, 2010

(54) POSITIONING APPARATUS, EXPOSURE APPARATUS, AND DEVICE MANUFACTURING METHOD

(75) Inventor: Zenichi Hamaya, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 268 days.

(21) Appl. No.: 11/929,375

(22) Filed: Oct. 30, 2007

(65) Prior Publication Data

US 2008/0136078 A1    Jun. 12, 2008

(30) Foreign Application Priority Data

Dec. 7, 2006    (JP)    .............................. 2006-331158

(51) Int. Cl.
*G01B 11/02* (2006.01)
*B23Q 1/25* (2006.01)

(52) U.S. Cl. ......................................... 356/500; 269/55

(58) Field of Classification Search ................ 356/496, 356/498, 500; 269/55
See application file for complete search history.

(56) References Cited

U.S. PATENT DOCUMENTS

| | | | |
|---|---|---|---|
| 4,814,625 A * | 3/1989 | Yabu | 250/548 |
| 5,469,260 A | 11/1995 | Takagi | |
| 5,550,633 A * | 8/1996 | Kamiya | 356/500 |
| 5,552,888 A * | 9/1996 | Sogard et al. | 356/500 |
| 5,870,198 A * | 2/1999 | Takagi | 356/500 |
| 5,875,031 A * | 2/1999 | Owa | 356/500 |
| 2001/0006422 A1 | 7/2001 | Fukagawa et al. | |
| 2001/0013925 A1 | 8/2001 | Loopstra et al. | |

FOREIGN PATENT DOCUMENTS

| | | |
|---|---|---|
| JP | 05-283313 A | 10/1993 |
| JP | 2001-160531 | 6/2001 |
| KR | 2001-0082053 | 8/2001 |

* cited by examiner

*Primary Examiner*—Michael A Lyons
(74) *Attorney, Agent, or Firm*—Canon USA Inc IP Div

(57) ABSTRACT

A positioning apparatus includes a stage base, a stage moving along a surface of the stage base, a cable having one end connected to the stage, and a straightening structure configured to straighten air currents around the cable. The straightening structure is provided to at least one of the stage and the cable.

15 Claims, 8 Drawing Sheets

WAFER PROCESSING

POSITIONING APPARATUS, EXPOSURE APPARATUS, AND DEVICE MANUFACTURING METHOD

BACKGROUND OF THE INVENTION

1. Field of the Invention

The present invention relates to a positioning apparatus for incorporation to apparatuses such as semiconductor exposure apparatuses, precision measuring apparatuses, precision processing apparatuses, and the like, requiring highly accurate processing and measurement. The present invention also relates to an exposure apparatus having the positioning apparatus and to a device manufacturing method using the exposure apparatus.

2. Description of the Related Art

It is necessary for semiconductor exposure apparatuses, precision measuring apparatuses, and precision processing apparatuses to be capable of highly accurately positioning a movable table. In such apparatuses, a laser interferometer is widely used for position measurement. However, laser interferometers are disadvantageous in that they are susceptible to fluctuations, i.e., changes in the refractive index caused by changes in temperature, humidity, and pressure of air along a length-measuring optical path. Therefore, a typical precision apparatus requires a constant-temperature atmosphere for maintaining the temperatures of apparatus components at a constant level. The atmosphere is maintained by supplying the apparatus with air maintained at a constant temperature. However, air currents passing over many heat-radiating elements, such as motors, included in the apparatus change their courses in a complicated manner to be mixed with air warmed by the heat-radiating elements. This continuously changes the temperature distribution along the length-measuring optical path and makes it difficult to maintain the temperature at a constant level.

In addition, if the movable table is provided with heat-radiating elements extending therefrom, the heat-radiating elements would exist near the optical path. Moreover, when the movable table moves, the elements also move while changing their forms. This creates a complicated flow field around the elements, thereby considerably increasing temperature fluctuations along the optical path. Hence, the laser interferometer often becomes affected by measurement noise due to such temperature fluctuations. Consequently, accuracy in position measurement becomes degraded. In order to prevent such degradation of measurement accuracy due to temperature fluctuations along the optical path, a first example of the related art discloses a method in which the optical path is provided with a cover that is extendable/contractible in the optical-axis direction or is sandwiched by a pair of parallel plates so as to block the entry of external air into the optical path and stop air currents inside the cover.

A second example of the related art discloses another method for preventing degradation of measurement accuracy in which the refractive index of air along the optical path is stabilized by supplying a laminar flow inside the cover provided over the optical path. Further, a third example of the related art discloses another method in which the refractive index of air along the optical path is stabilized by providing a baffle for suitably directing air currents near to the optical path so that air with a constant temperature and humidity is directly and locally supplied to the optical path. Furthermore, Japanese Patent No. 3089802 discloses a stage-position-measuring apparatus in which influence of the above fluctuations in measuring the position of a movable stage with a laser interferometer is reduced by providing a cover for each of a reference-beam path and a measuring-beam path of the laser interferometer and by supplying temperature-controlled air to the inside of the cover.

The first and second examples of the related art, however, have problems that the optical-path cover limits stage movement and that stage movement allows entry of ambient air to the inside of the cover, thereby changing the refractive index of air therein. In the third example of the related art, if apparatus components are provided near the optical path or if a blowhole is provided far from the optical path, the flow rate of air may vary with measured location and it may be difficult to supply air having a uniform refractive index to the entirety of the optical path. Further, since turbulence may occur around the optical path and ambient air thereof may be drawn into the turbulence, it is highly possible that the refractive index will fluctuate along the optical path. It is also disadvantageous that, in order to supply air having a highly controlled constant temperature and humidity, a high-cost large-scale apparatus for controlling and supplying air is required.

Furthermore, if the stage-driving mechanism is constituted by a flat linear motor or the like, the stage needs to be mounted by using mounting cables that would extend therefrom. Mounting cables radiate heat. That is, heat-radiating elements would exist in close proximity to the length-measuring optical path. Therefore, in the above three examples of the related art, it is difficult to fully minimize influence of the heat-radiating elements provided near the optical path. Additionally, in such a stage-driving mechanism, the mounting cables move in response to stage movement while changing their forms. As the cables move fast, ambient air heated not only by heat radiation from the movable table and the cables but also by heat radiation due to electrical overcurrent between the movable table and a base is complicatedly stirred up by the cable movement. When the heated air reaches the optical path of the interferometer, temperature along the optical path may fluctuate. This also shows that it is difficult to reduce temperature fluctuations along the optical path of the interferometer by applying only the method of any of the first to third examples of the related art.

SUMMARY OF THE INVENTION

The present invention is directed to a positioning apparatus having a simple configuration in which measurement accuracy is improved by reducing temperature fluctuations along an optical path caused by movement of a heat-radiating cable provided near a stage, the movement of which the cable follows while changing its form.

A positioning apparatus according to an aspect of the present invention includes a stage base, a stage moving along a surface of the stage base, a cable having one end connected to the stage, and a straightening structure configured to straighten air currents around the cable. The straightening structure is provided to at least one of the stage and the cable.

Further features of the present invention will become apparent from the following description of exemplary embodiments with reference to the attached drawings.

DESCRIPTION OF THE EMBODIMENTS

Figure 1:
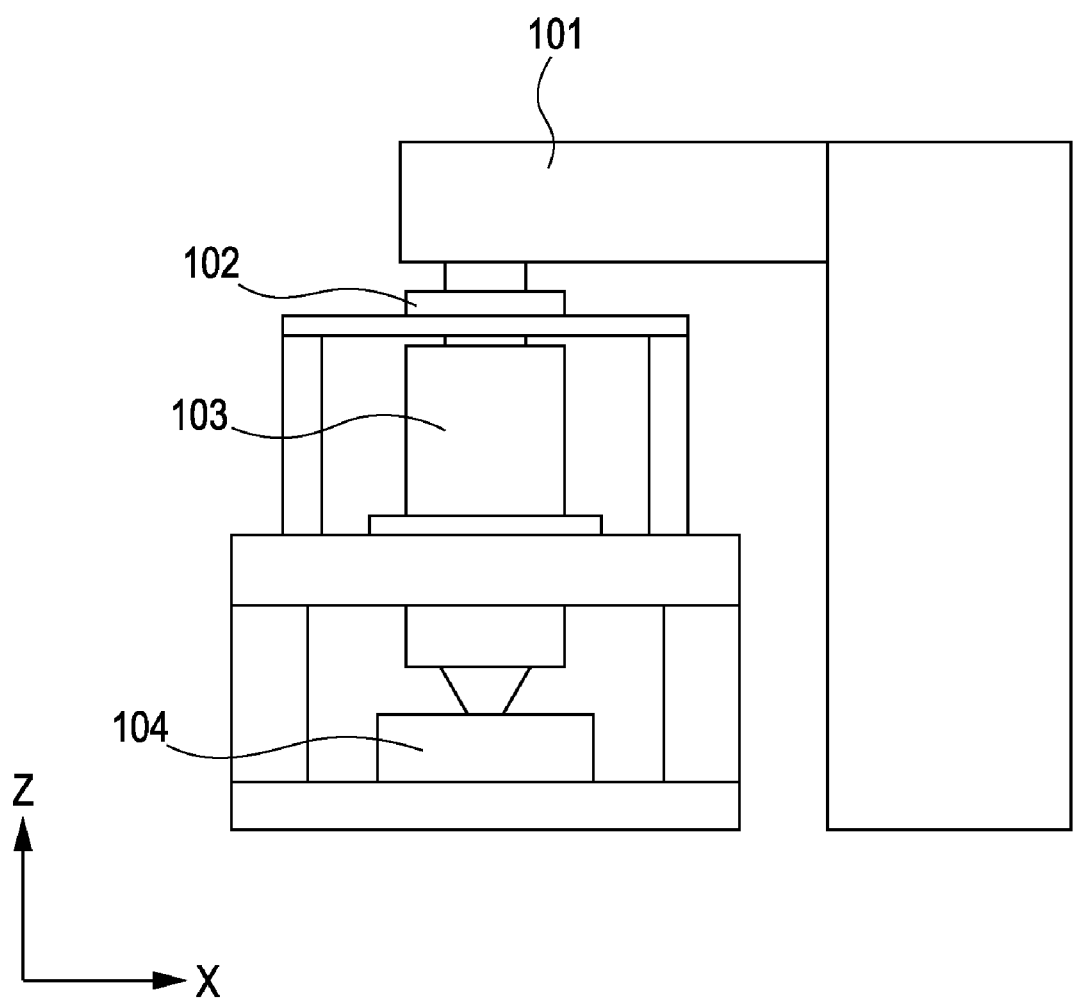
FIG. 1 illustrates an overall structure of an exposure apparatus according to a first embodiment of the invention.

Embodiments of the present invention will now be described referring to the drawings.

First Embodiment

Figure 2A:
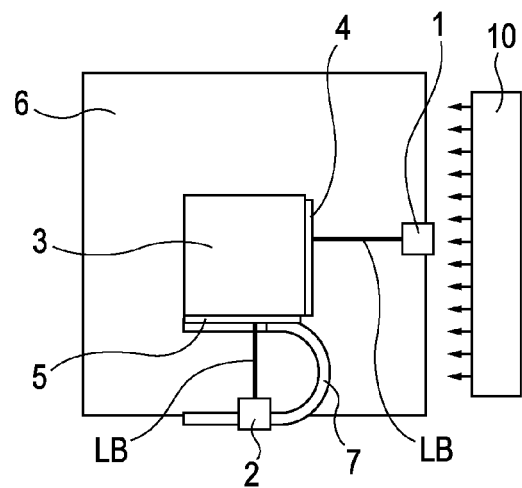
FIG. 2A is a top view of a positioning apparatus according to the first embodiment of the invention.
Figure 2B:
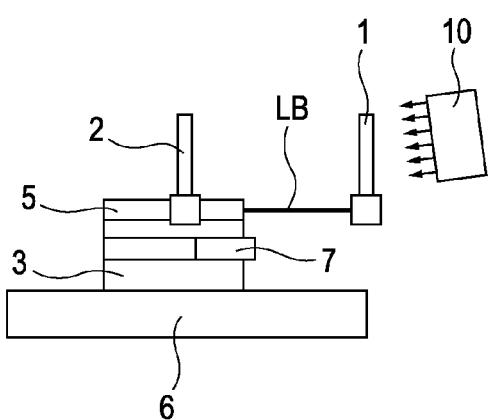
FIG. 2B is a side view of the positioning apparatus shown in FIG. 2A.
Figure 2C:
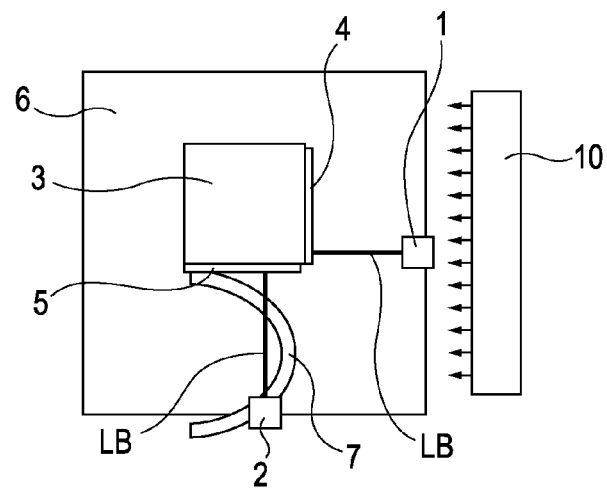
FIG. 2C is a top view of the positioning apparatus shown in FIG. 2A when a stage thereof is moved.

A positioning apparatus according to a first embodiment of the invention will be briefly described first referring to FIGS. 2A to 2C. The positioning apparatus according to the first embodiment of the invention includes a stage base 6, a stage 3 moving along the top surface of the stage base 6, and a blower 10 for blowing air toward the stage 3.

The stage base 6 has a flat body spreading along an XY plane. The stage 3 can arbitrarily move in the X and Y directions above the stage base 6. The blower 10 blows appropriately temperature-controlled cooling air to the entire space above the stage base 6. The positioning apparatus is provided with a plurality of cables covered by a flexible cable cover 7. The cables move in response to the movement of the stage 3, with one end of each cable being connected to the stage 3.

The cable cover 7, which is made of, for example, a flexible member, bundles the cables. Power for driving the stage 3 arbitrarily in the X and Y directions is supplied through the cables.

The positioning apparatus also includes interferometers 1 and 2 for measuring the position of the stage 3 by radiating a laser beam, and reflecting mirrors 4 and 5 provided above the stage 3 and reflecting the laser beam toward the interferometers 1 and 2, respectively. The interferometer 1 measures the position of the stage 3 in the direction of a first axis, i.e., the X direction, by radiating a laser beam in the X direction to the reflecting mirror 4 of the stage 3 and receiving the laser beam reflected from the reflecting mirror 4. The interferometer 2 measures the position of the stage 3 in the direction of a second axis, i.e., the Y direction, by radiating a laser beam in the Y direction to the reflecting mirror 5 of the stage 3 and receiving the laser beam reflected from the reflecting mirror 5. The positioning apparatus includes a straightening structure for straightening air currents around the cable cover 7 occurring when the cable cover 7 moves. The straightening structure is provided to at least one of the stage 3 and the cable cover 7.

In the first embodiment, referring to FIGS. 3A to 3E, the straightening structure is a straightening plate 8 that extends/retracts over the cable cover 7. The straightening plate 8 is constituted by slidably stacking a plurality of plates that extend/retract over the cable cover 7 with the aid of slide sections.

Exemplary Configuration of Exposure Apparatus in First Embodiment

An exemplary exposure apparatus to which the positioning apparatus according to the first embodiment of the invention is applied will now be described. Referring to FIG. 1, the exposure apparatus includes an illumination device 101, a reticle stage 102 on which a reticle is mounted, a projection optical system 103, and a wafer stage 104 on which a wafer is mounted. The exposure apparatus projects and exposes a circuit pattern formed on the reticle onto the wafer, for example, by the step-and-repeat projection/exposure method or the step-and-scan projection/exposure method. The illumination device 101 includes a light source unit and an illumination optical system and illuminates the reticle having the circuit pattern.

The light source unit employs, for example, a laser as a light source. Examples of the laser include an ArF excimer laser having a wavelength of about 193 nm, a KrF excimer laser having a wavelength of about 248 nm, an F2 excimer laser having a wavelength of about 153 nm, and the like. However, the laser is not limited to excimer lasers and may be a YAG laser, for example. Further, the number of lasers used is also not especially limited. When a laser is used as the light source, a light-flux-shaping optical system for shaping parallel light flux emitted from the laser source or an incoherent optical system that converts coherent laser flux into incoherent laser flux can be used. Further, the light source applicable to the light source unit is not limited to a laser and may be one or more lamps such as mercury lamps or xenon lamps. The illumination optical system includes a lens, a mirror, a light integrator, an aperture, and the like, and illuminates a reticle or a mask. The projection optical system 103 may also be an optical system including only a plurality of lens elements, an optical system (catadioptric optical system) including a plurality of lens elements and at least one concave mirror, or the like. The projection optical system 103 may be an optical system including a plurality of lens elements and at least one diffractive optical element such as a kinoform, an optical system including only a plurality of mirrors, or the like. The reticle stage 102 and the wafer stage 104 can be moved by, for example, a linear motor. In the step-and-scan projection/exposure method, the stages 102 and 104 move synchronously. Further, in order to align the pattern of the reticle onto the wafer, a separate actuator is provided to at least one of the wafer stage 104 and the reticle stage 102.

The above-described exposure apparatus can be used in manufacturing semiconductor devices, such as semiconductor integrated circuits, or finely patterned devices, such as micromachines and thin-film magnetic heads. Next, referring to FIGS. 2A to 2C, the positioning apparatus, included in the exposure apparatus, according to the first embodiment of the invention will be described in detail. FIG. 2A is a top view of the positioning apparatus according to the first embodiment of the invention. FIG. 2B is a side view of the positioning apparatus shown in FIG. 2A. FIG. 2C is a top view of the positioning apparatus shown in FIG. 2A when a stage thereof is moved to a certain location. The positioning apparatus is applied to, for example, a coarse-motion stage driven with a reticle being mounted thereon in the reticle stage 102 and a coarse-motion stage driven with a wafer being mounted thereon in the wafer stage 104. Although the positioning apparatus can also be applied to a fine-motion stage in the reticle stage 102 or the wafer stage 104, description of such applications is omitted herein.

Since the two coarse-motion stages have similar configurations, a coarse-motion stage driven with a wafer being mounted thereon in the wafer stage 104 will be described as an example. The coarse-motion stage serving as the positioning apparatus has a configuration of a flat linear motor utilizing, for example, a permanent magnet and an electrical element, in which the stage base 6 and the stage 3 provided thereabove for mounting and holding a wafer are included. For example, the stage 3 includes the electrical element, and the stage base 6 includes the permanent magnet. The stage 3 including the electrical element is supplied with a driving power for enabling arbitrary driving in the X and Y directions to be performed through mounting cables that can freely change their forms. The mounting cables, which are provided for mounting the stage 3, extend from the stage 3 and are covered with the cable cover 7 that can freely change its form.

The interferometer 1 arranged on the first axis that measures the position of the stage 3 in the X direction is provided on an edge of the stage base 6 in the X direction. The interferometer 1 arranged on the first axis measures the position of the stage 3 in the X direction by irradiating a laser beam LB onto the reflecting mirror 4, which is provided on a side of the stage 3 in the X direction and facing the interferometer 1, and receiving the laser beam LB reflected therefrom. The interferometer 2 arranged on the second axis that measures the position of the stage 3 in the Y direction is provided on an edge of the stage base 6 in the Y direction.

The interferometer 2 arranged on the second axis measures the position of the stage 3 in the Y direction by irradiating a laser beam LB onto the reflecting mirror 5, which is provided on a side of the stage 3 in the Y direction and facing the interferometer 2, and receiving the laser beam LB reflected therefrom.

The cable cover 7 is connected to an edge of the stage 3 in the Y direction, i.e., the side where the reflecting mirror 5 is provided. Therefore, the mounting heights of the interferometer 2 arranged on the second axis and the reflecting mirror 5 on the stage 3 are set to be higher than the mounting height of the mounting cable. The cable cover 7 is not necessarily connected to the edge of the stage 3 in the Y direction, but may be connected to the edge in the X direction. Because the cable cover 7 radiates heat, temperature fluctuations due to the heated air tend to occur around the optical path of the laser beam LB emitted from the interferometer 2 arranged on the second axis. Therefore, the blower 10 is installed near an edge of the stage base 6. The blower 10 blows temperature-controlled air over the entirety of the stage base 6 including the optical path of the laser beam LB emitted from the interferometer 2. The blower 10 is not necessarily installed near the edge of the stage base 6 where the interferometer 1 arranged on the first axis is provided, but may be installed near the edge of the stage base 6 where the interferometer 2 arranged on the second axis is provided. Alternatively, the blower 10 may be installed above the stage base 6 so as to blow the air downward over the entirety thereof.

Figure 3A:
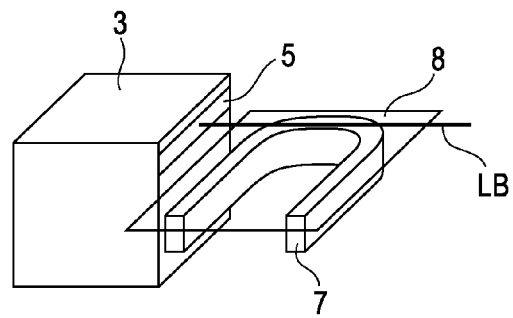
FIG. 3A is a perspective view of the positioning apparatus according to the first embodiment.
Figure 3B:
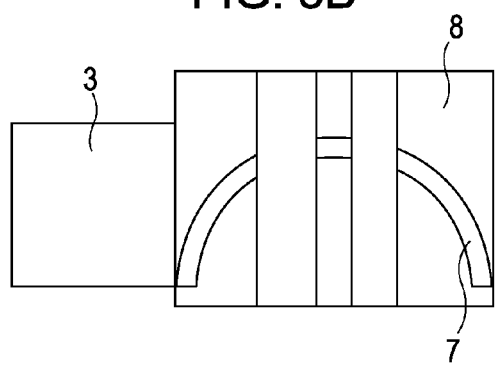
FIG. 3B is a top view of the positioning apparatus according to the first embodiment, showing a cable cover in a straightened state.
Figure 3C:
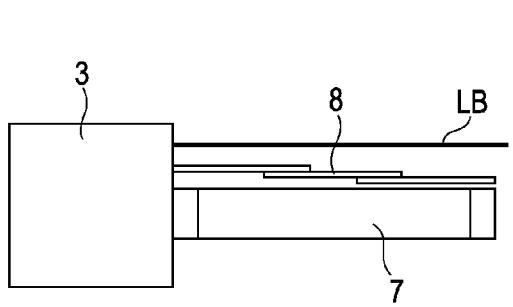
FIG. 3C is a side view of the positioning apparatus according to the first embodiment seen in the X direction, showing the same state as in FIG. 3B.
Figure 3D:
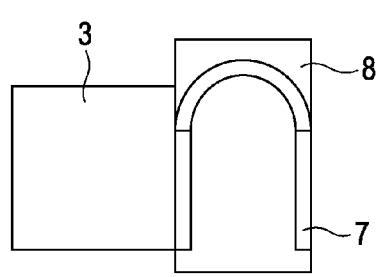
FIG. 3D is a top view of the cable cover in a bent state.
Figure 3E:
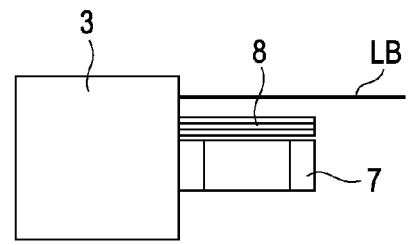
FIG. 3E is a side view of the positioning apparatus according to the first embodiment seen in the X direction, showing the same state as in FIG. 3D.

FIGS. 3A to 3E are views of the positioning apparatus according to the first embodiment, in which FIG. 3A is a perspective view, FIG. 3B is a top view showing the cable cover 7 in a straightened state, FIG. 3C is a side view from the X direction, showing the cable cover 7 in the same state as in FIG. 3B, FIG. 3D is a top view showing the cable cover 7 in a bent state, and FIG. 3E is a side view from the X direction, showing the cable cover 7 in the same state as in FIG. 3D. As shown in FIGS. 3A to 3E, a straightening plate 8 that constantly covers the entirety of the cable cover 7 in any shape is provided above the cable cover 7. The straightening plate 8 is provided between the cable cover 7 and the optical path of the interferometer 2 arranged on the second axis, and includes a plurality of vertically stacked slidable plates.

Each plate of the straightening plate 8 is supported by a slide section (not shown) so as to be able to be extended or retracted without interfering with the other plates. The slide section may not necessarily slide in the Y direction, but may slide in the X direction and in the XY direction. Whether a slide section that can slide only in the Y direction is employed is arbitrary. The width of each plate is determined so as not to produce any gap between the individual plates when the straightening plate 8 is fully extended, and so as not to interfere with the cable cover 7 in a fully bent state when the straightening plate 8 is fully retracted. The top plate of the straightening plate 8 or the slide section thereof is fixed to the side of the stage 3 or the edge of the cable cover 7 on the stage 3 side. The top plate slides as the stage 3 moves, thereby causing the straightening plate 8 to be extended or retracted.

As shown in FIGS. 3B and 3C, when the straightening plate 8 is fully extended, each of the plates has slid the maximum. This enables the straightening plate 8 to cover the entirety of the cable cover 7 in a fully straightened state. The bottom plate of the straightening plate 8 or the slide section thereof is fixed to, for example, the edge of the cable cover 7 on the interferometer 2 side or a member for fixing the edge. Therefore, the bottom plate does not move from the fixed position while the straightening plate 8 is extended or retracted. As shown in FIGS. 3D and 3E, when the straightening plate 8 is fully retracted along with the movement of the stage 3, each of the plates is stacked on top of another plate so as not to interfere with the cable cover 7 in a fully bent state. While the cable cover 7 straightens or bends along with the movement of the stage 3, the straightening plate 8 constantly covers the entirety of the cable cover 7.

To protect the cable cover 7 from friction, the bottom plate of the straightening plate 8 is provided near the cable cover 7 but in a non-contact manner. However, the bottom plate of the straightening plate 8 may be lightly in contact with the cable cover 7 if the plate is made of a material with a low coefficient of friction. The straightening plate 8 is not necessarily of the type including a plurality of plates stacked on top of each other but may be of any structure as long as it can constantly cover the flexible cable cover 7. For example, a single plate having a foldable portion, a single stretchable rubber sheet, or the like, may be employed. In any case, the straightening plate 8 is not necessarily extended or retracted in one direction, but may be extended in the X and Y directions, or extended in the XY direction.

Figure 4A:
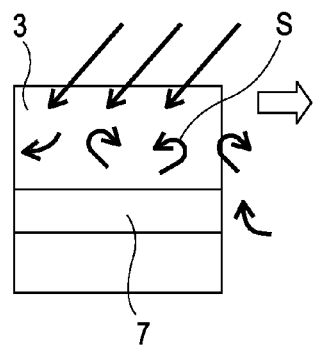
FIG. 4A illustrates turbulent air currents occurring without a straightening plate in the positioning apparatus according to the first embodiment.
Figure 4B:
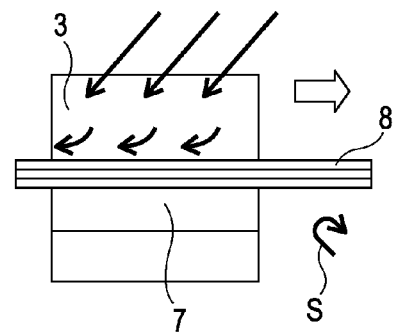
FIG. 4B illustrates prevention of turbulent air currents using the straightening plate in the first embodiment.

FIG. 4A illustrates turbulent air currents occurring without the straightening plate 8, and FIG. 4B illustrates prevention of turbulent air currents using the straightening plate 8. Referring to FIG. 4A, without the straightening plate 8, the cable cover 7 stirs up the ambient air when the stage 3 moves. This creates a very complex flow field S around the cable cover 7. The turbulent air currents stir up the air warmed by the heat from the cable cover 7 and the stage 3 or the heat caused by electrical overcurrent between the stage 3 and the stage base 6, thereby causing temperature fluctuations. The air with the temperature fluctuations is stirred up near the optical path of the interferometer 2 arranged on the second axis due to the cable cover 7. This may cause a measurement error when the interferometer 2 measures the movement of the stage 3.

Referring to FIG. 4B, with the straightening plate 8, the cable cover 7 is prevented from stirring up the warmed air. Therefore, the turbulent air currents that cause the temperature fluctuations do not occur in the optical path of the interferometer 2 arranged on the second axis, whereby occurrence of a measurement error is suppressed. In other words, with the straightening plate 8, the straightening plate 8 prevents the air with the temperature fluctuations from entering the optical path of the interferometer 2. The temperature of the optical path is maintained at an appropriate value by the blower 10 blowing temperature-controlled air thereon, whereby a cause of the measurement error is eliminated. Accordingly, the interferometer 2 arranged on the second axis is able to constantly measure the movement of the stage 3 with high accuracy. This allows for repeated positioning of a wafer on the coarse-motion stage with high accuracy, whereby the exposure accuracy is further stabilized and is kept at a high level. Although the cable cover 7 shown in the first embodiment is deformed while maintaining an arch shape, the cable cover 7 is not limited to such a type. A cable cover that is deformed at a joint also produces a similar advantage as above.

Second Embodiment

Figure 5A:
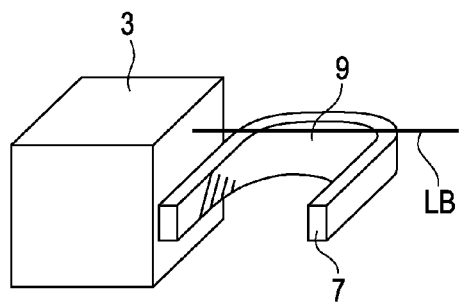
FIG. 5A is a perspective view of a positioning apparatus according to a second embodiment showing a cable cover in a bent state.
Figure 5B:
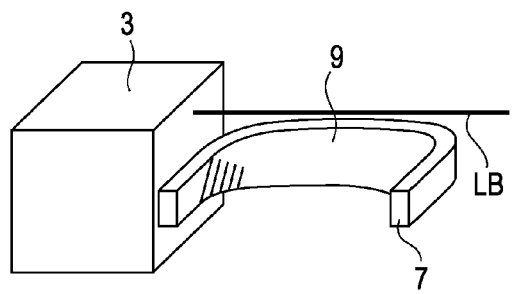
FIG. 5B is a perspective view of the cable cover in a straightened state.
Figure 5C:
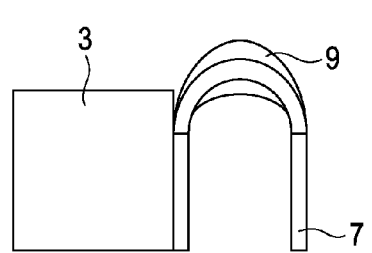
FIG. 5C is a top view of the cable cover in the bent state as shown in FIG. 5A.
Figure 5D:
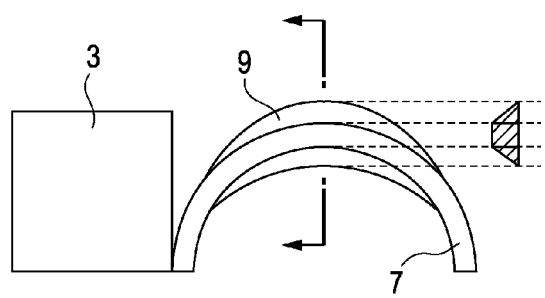
FIG. 5D is a top view of the cable cover in the straightened state as shown in FIG. 5B.

Now, a second embodiment according to the invention will be described. In a positioning apparatus according to the second embodiment, a straightening structure has a flexible sloped structure that broadens outwardly from the top to the bottom of the cable cover 7. FIGS. 5A to 5D are views of the cable cover 7 of the positioning apparatus according to the second embodiment, in which FIG. 5A is a perspective view showing the cable cover 7 in a bent state, FIG. 5B is a perspective view showing the cable cover 7 in a straightened state, FIG. 5D is a top view of the cable cover 7 in a straightened state as shown in FIG. 5B, and FIG. 5C is a top view of the cable cover 7 in a bent state as shown in FIG. 5A. In the second embodiment, as shown in FIGS. 5A and 5B, the cable cover 7 has an integrally formed flexible sloped portion 9 that broadens outwardly from the top to the bottom of the cable cover 7.

The sloped portion 9 is made of a material similar to that of the flexible cable cover 7. Therefore, the sloped portion 9 is deformed along with the deformation of the cable cover 7 while maintaining the sloped shape. As also shown in FIG. 5C, the sloped portion 9 obliquely and outwardly projects from the top of the cable cover 7. The sloped portion 9 has a trapezoid cross-section in which the bottom surface (moving surface) of the cable cover 7 is wide. As shown in FIGS. 5C and 5D, the sloped portion 9 is not necessarily provided for the entire length of the cable cover 7, but may be provided for at least a portion of a predetermined length in the center of the cable cover 7. For example, the sloped portion 9 has a length so that it can be positioned just below the optical path of the laser beam LB emitted from the interferometer 2 arranged on the second axis even when the cable cover 7 is deformed.

Figure 9A:
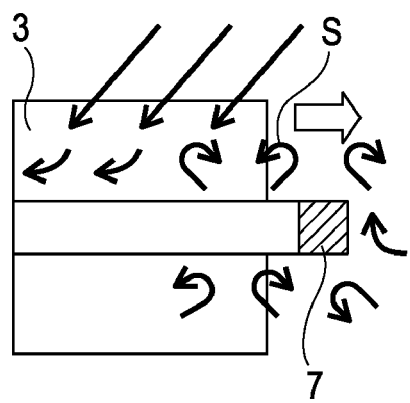
FIG. 9A illustrates turbulent air currents occurring without a sloped portion in the positioning apparatus according to the respective embodiments.
Figure 9B:
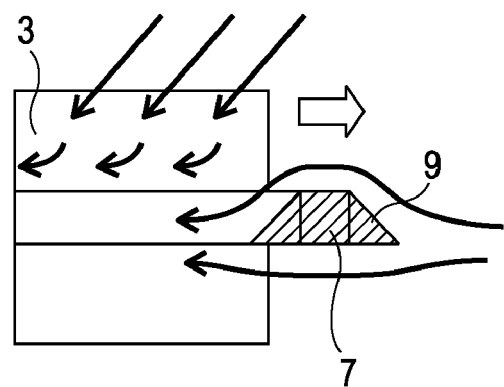
FIG. 9B illustrates prevention of turbulent air currents using the sloped portion in the respective embodiments.

FIG. 9A illustrates turbulent air currents occurring without the sloped portion 9, and FIG. 9B illustrates prevention of turbulent air currents using the sloped portion 9. Referring to FIG. 9A, without the sloped portion 9, the cable cover 7 stirs up the ambient air when the stage 3 moves. This creates a very complex flow field S around the cable cover 7 and causes temperature fluctuations, resulting in the same problem as in the related art method. Referring to FIG. 9B, with the sloped portion 9, the air is prevented from being stirred up vertically, and the flow field S around the cable cover 7 becomes almost laminar. Accordingly, as shown in FIG. 9B, even when the air is warmed by the heat from the cable cover 7 and the stage 3 or the heat caused by electrical overcurrent between the stage 3 and the stage base 6, the flow field S around the cable cover 7 does not cause considerable turbulence, and the air continues to flow adversely to the direction of travel of the stage 3. The sloped portion 9 suppresses the turbulent air currents that cause the temperature fluctuations, and prevents the air currents from being stirred up vertically to enter the optical path of the interferometer 2 arranged on the second axis. Accordingly, the measurement accuracy of the interferometer 2 can be improved.

Third Embodiment

Figure 6A:
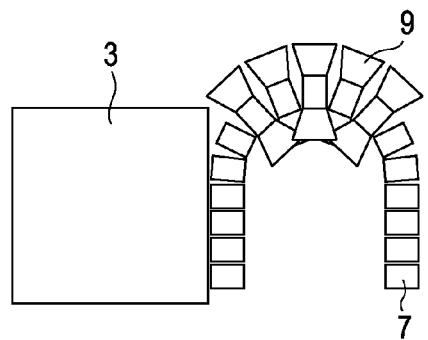
FIG. 6A is a top view of a cable cover of a positioning apparatus according to a third embodiment.
Figure 6B:
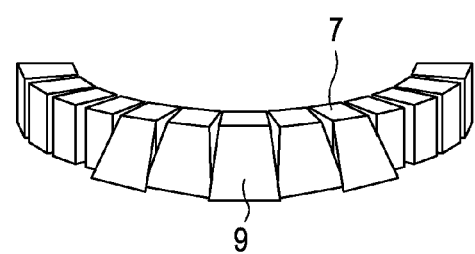
FIG. 6B is a perspective view of the cable cover shown in FIG. 6A.

Now, a third embodiment according to the invention will be described. In a positioning apparatus according to the third embodiment, the cable cover 7 includes a plurality of blocks connected in series, and the straightening structure has a sloped structure that broaden outwardly from the top to the bottom of the central blocks of the cable cover 7. The sloped portions are alternately differentiated in size. FIGS. 6A and 6B are a top view and a perspective view of the cable cover 7 of the positioning apparatus according to the third embodiment, respectively.

As shown in FIGS. 6A and 6B, the cable cover 7 according to the third embodiment includes a plurality of blocks. The sloped portions 9 are provided for a plurality of blocks corresponding to at least a portion of a predetermined length of the cable cover 7 extending from the center block thereof.

As described in the description of the second embodiment, the sloped portions 9 provided for central blocks of the cable cover 7 broaden outwardly from the top to the bottom of each block of the cable cover 7. The gradients of slope, or both gradients of slope and widths of bottom sides of sloped portions 9 are alternately differentiated so that the sloped portions 9 overlap each other along with the deformation of the cable cover 7. The cable cover 7 including blocks may be formed by cutting slits in a continuous cover or by connecting individual blocks with joints. The sloped portion 9 is positioned just below the optical path of the interferometer 2 even when the cable cover 7 is deformed.

Fourth Embodiment

Figure 7A:
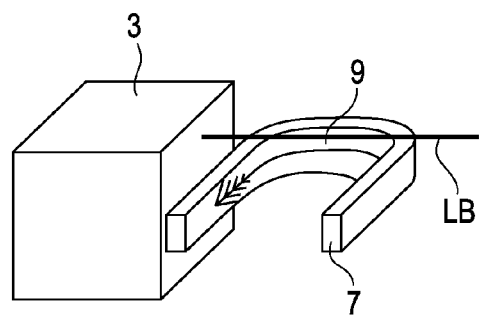
FIG. 7A is a perspective view of a positioning apparatus according to a fourth embodiment, showing a cable cover in a bent state.
Figure 7B:
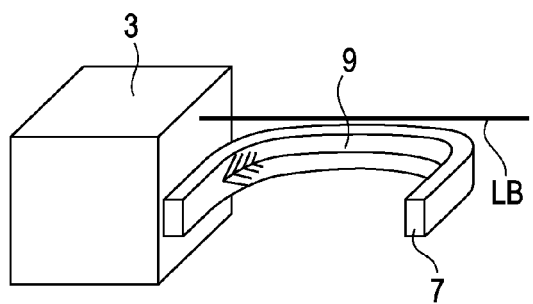
FIG. 7B is a perspective view of the cable cover in a straightened state.
Figure 7C:
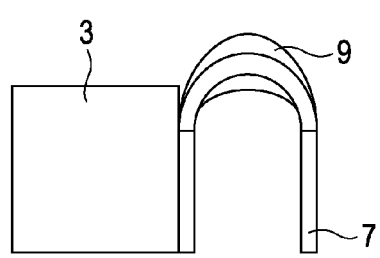
FIG. 7C is a top view of the cable cover in the bent state as shown in FIG. 7A.
Figure 7D:
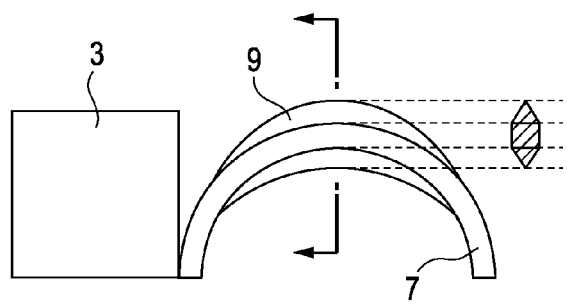
FIG. 7D is a top view of the cable cover in the straightened state as shown in FIG. 7B.

Now, a fourth embodiment according to the invention will be described. In a positioning apparatus according to the fourth embodiment, the straightening structure has a flexible sloped structure having a diamond-shaped cross-section that broadens outwardly from the top of the cable cover 7 and then narrows inwardly to the bottom of the cable cover 7 after the halfway point. FIGS. 7A to 7D are views of the cable cover 7 of the positioning apparatus according to the fourth embodiment, in which FIG. 7A is a perspective view showing the cable cover 7 in a bent state, FIG. 7B is a perspective view showing the cable cover 7 in a straightened state, FIG. 7D is a top view of the cable cover 7 in a straightened state as shown in FIG. 7B, and FIG. 7C is a top view of the cable cover 7 in a bent state as shown in FIG. 7A. As shown in FIGS. 7A and 7B, the cable cover 7 according to the fourth embodiment has an integrally formed flexible sloped portion 9 having a diamond-shaped cross-section that broadens outwardly from the top and from the bottom of the cable cover 7 and meets the halfway point.

Because the sloped portion 9 is made of a material similar to that of the flexible cable cover 7, the sloped portion 9 is flexibly deformed along with the deformation of the cable cover 7, while maintaining the sloped shape. The other structures are similar to those according to the second embodiment.

Fifth Embodiment

Figure 8:
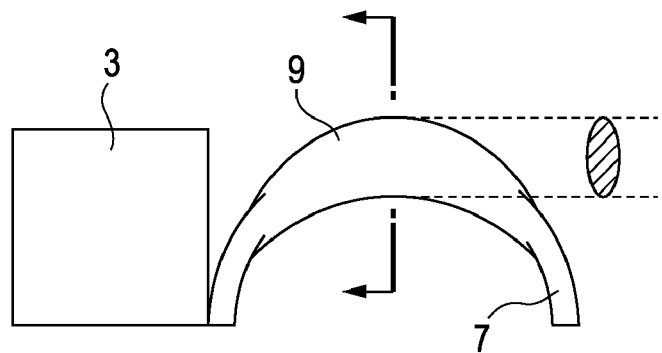
FIG. 8 is a top view of a cable cover of a positioning apparatus according to a fifth embodiment.

Now, a fifth embodiment according to the invention will be described. In a positioning apparatus according to the fifth embodiment, the straightening structure has a flexible sloped structure having a smoothly changing gradient cross-section that broadens outwardly from the top of the cable cover 7 and then narrows inwardly to the bottom of the cable cover 7 after the halfway point. FIG. 8 is a top view of the cable cover 7 of the positioning apparatus according to the fifth embodiment. As shown in FIG. 8, the cable cover 7 according to the fifth embodiment has an integrally formed flexible sloped portion 9 having a streamline-shaped cross-section that broadens outwardly from the top and the bottom of the cable cover 7 to meet halfway. Because the sloped portion 9 is made of a material similar to that of the flexible cable cover 7, the sloped portion 9 is flexibly deformed along with the deformation of the cable cover 7, while maintaining the sloped shape. The other structures are similar to those according to the second embodiment.

The sloped portion 9 having a streamline-shaped cross-section more effectively suppresses the turbulent air currents that cause the temperature fluctuations, and more effectively prevents the air currents from being stirred up vertically to enter the optical path of the interferometer 2 arranged on the second axis. Accordingly, the measurement accuracy of the interferometer 2 can be further improved. By using the straightening plate 8 and the sloped portion 9 in combination, the temperature fluctuations along the optical path of the interferometer 2 can be further reduced.

The sloped portion 9 produces a laminar flow field around the cable cover 7, and the straightening plate 8 covers the cable cover 7. Thus, the optical path of the interferometer 2 is separated from the turbulent air currents caused by the cable cover 7, whereby the temperature fluctuations along the optical path can be made extremely small.

Embodiment of Device Manufacturing Method

Figure 10:
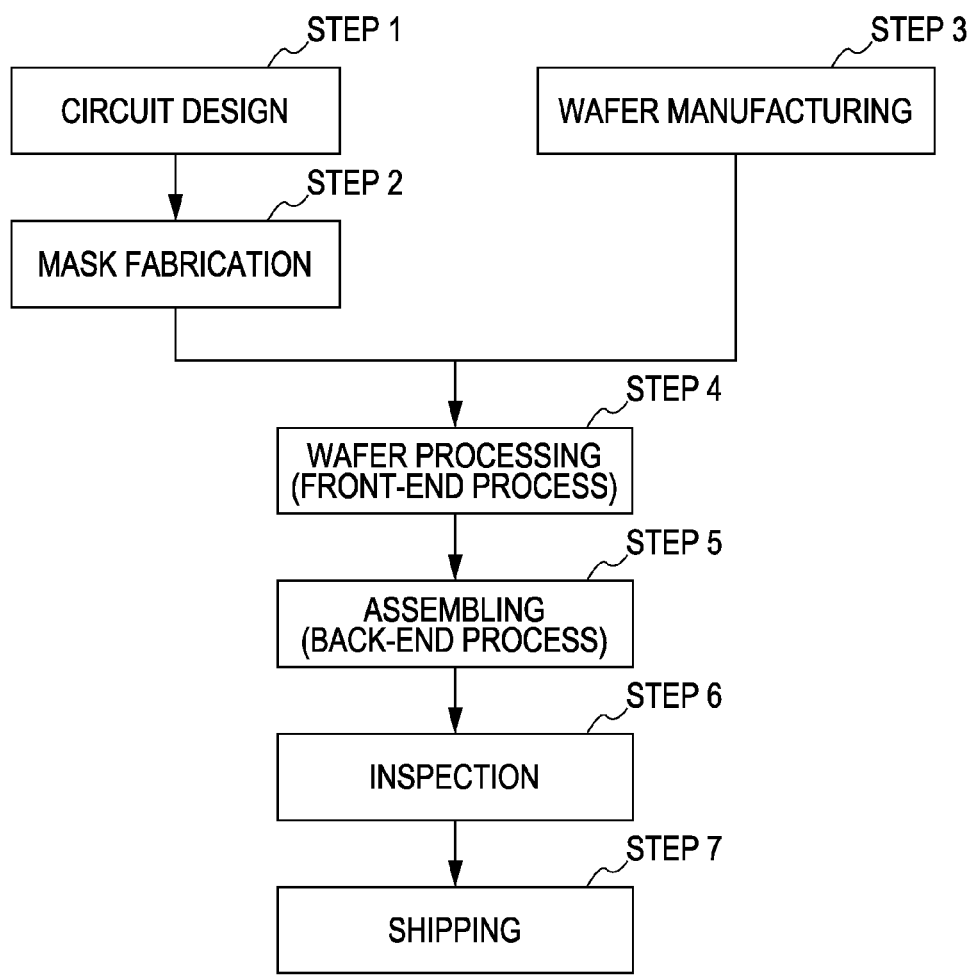
FIG. 10 is a flowchart for describing a method for manufacturing devices using an exposure apparatus according to an aspect of the invention.

Now, referring to FIGS. 10 and 11, an embodiment of a device manufacturing method utilizing the above-described exposure apparatus will be described. FIG. 10 is a flowchart for describing a method for manufacturing devices (e.g., semiconductor chips such as integrated circuit (IC) chips and large-scale integrated circuit (LSI) chips, light coupled devices (LCDs), and charge-coupled devices (CCDs)). An exemplary method for manufacturing semiconductor chips will be described herein. In STEP 1 (circuit design), a circuit of a semiconductor device is designed. In STEP 2 (mask fabrication), a mask is fabricated on the basis of the circuit pattern designed in STEP 1. A reticle may be fabricated in this step. In STEP 3 (wafer manufacturing), wafers are manufactured using a material such as silicon or the like. In STEP 4 (wafer processing), which is called a front-end process, using the mask and the wafers, the circuit is formed on the wafers with the exposure apparatus by lithography. In STEP 5 (assembling), which is called a back-end process, the wafers fabricated in STEP 4 Are formed into semiconductor chips. The assembly process includes dicing, bonding, packaging (chip encapsulation), and the like. In STEP 6 (inspection), the semiconductor devices fabricated in STEP 5 undergo an operation inspection, a durability inspection, and the like. In STEP 7, semiconductor devices realized after performing the above processes are subject to shipment.

Figure 11:
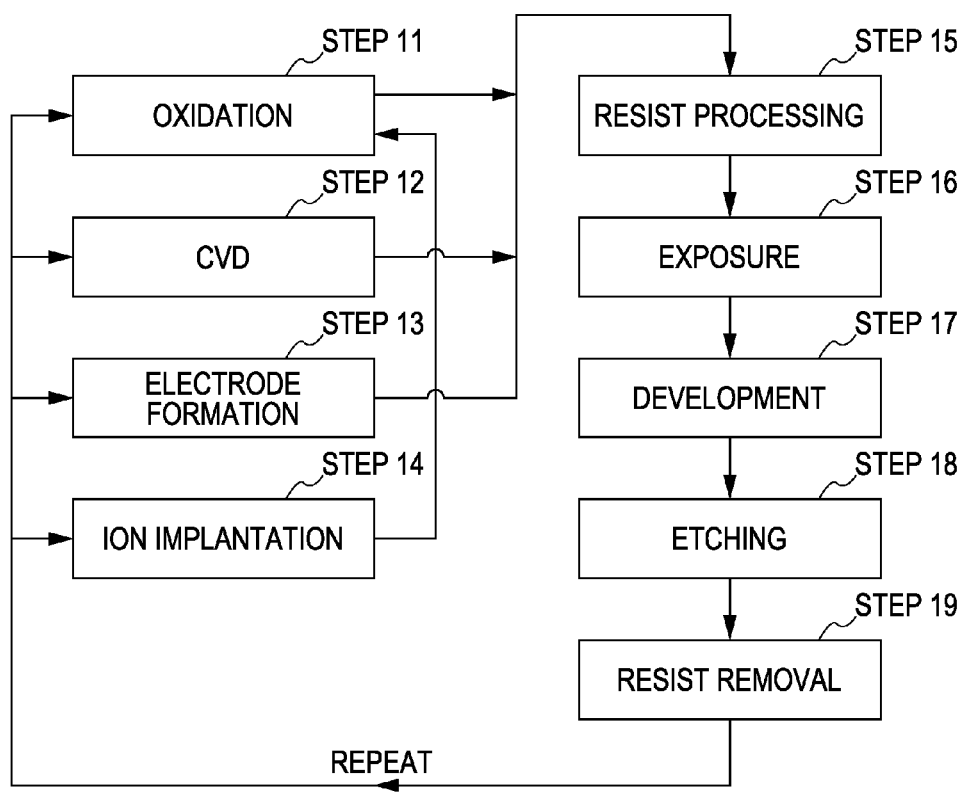
FIG. 11 is a flowchart showing details of the wafer processing (step S4) shown in FIG. 10.

FIG. 11 is a flowchart showing details of the wafer processing (STEP 4). In STEP 11 (oxidation), the surfaces of the wafers are oxidized. In STEP 12 (chemical vapor deposition (CVD)), insulating films are formed on the surfaces of the wafers. In STEP 13 (electrode formation), electrodes are formed on the wafers. In STEP 14 (ion implantation), ions are implanted into the wafers. In STEP 15 (resist processing), a resist is applied onto the wafers. In STEP 16 (exposure), the circuit pattern on the mask is exposed onto the wafers with the exposure apparatus. In STEP 17 (development), the exposed wafers are developed. In STEP 18 (etching), portions other than the developed resist image are etched off. In STEP 19, (resist removal) the resist after the etching is removed. By repeating these steps, layers of circuit patterns are formed on the wafers.

In this device manufacturing method, by using the above-described exposure apparatus, the reliability of manufactured devices can be further improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-331158, filed Dec. 7, 2006 which is hereby incorporated by reference herein in its entirety.

What is claimed is:
1. A positioning apparatus comprising:
a stage base;
a stage moving along a surface of the stage base;
a cable having one end connected to the stage; and
a straightening structure configured to straighten air currents around the cable, the straightening structure being provided to at least one of the stage and the cable.

2. The positioning apparatus according to claim 1, further comprising an interferometer for measuring a position of the stage.

3. The positioning apparatus according to claim 2, further comprising a mirror provided on the stage and a blower for blowing air toward the stage.

4. An exposure apparatus including the positioning apparatus of claim 1. substrate to radiation, said apparatus comprising:
- a stage base;
- a stage moving along a surface of the stage base;
- a cable having one end connected to the stage; and
- a straightening structure configured to straighten air currents around the cable, the straightening structure being provided to at least one of the stage and the cable.

5. A positioning apparatus comprising:
- a stage base;
- a stage moving along a surface of the stage base;
- a cable having one end connected to the stage; and
- a plate positioned such that the cable is sandwiched between the plate and the stage base.

6. The positioning apparatus according to claim 5, wherein the plate includes a plurality of plates and is movable over the cable in response to movement of the cable.

7. An exposure apparatus including the positioning apparatus according to claim 5.

8. A device manufacturing method comprising:
- exposing a wafer by using the exposure apparatus according to claim 5; and
- developing the wafer.

9. A positioning apparatus comprising:
- a stage base;
- a stage moving along a surface of the stage base;
- a cable having one end connected to the stage; and
- a structure provided on the cable; wherein the structure has a cross-section of a shape tapered in a direction away from a level of a surface of the structure.

10. The positioning apparatus according to claim 9, wherein the structure has a substantially triangle, trapezoid, diamond-shaped, or elliptical cross-section.

11. The positioning apparatus according to claim 9, wherein the structure has a substantially streamline-shaped cross-section.

12. The positioning apparatus according to claim 9, wherein the structure includes a plurality of blocks.

13. An exposure apparatus including the positioning apparatus according to claim 9.

14. A device manufacturing method comprising:
- exposing a wafer by using the exposure apparatus according to claim 9; and
- developing the wafer.

15. A device manufacturing method comprising:
- exposing a substrate to radiation using an exposure apparatus;
- developing the exposed substrate; and
- processing the developed substrate to manufacture the device; wherein the exposure apparatus is configured to expose the substrate to radiation and comprises:
- a stage base;
- a stage moving along a surface of the stage base;
- a cable having one end connected to the stage; and
- a straightening structure configured to straighten air currents around the cable, the straightening structure being provided to at least one of the stage and the cable.

* * * * *